US006868279B2

United States Patent
Sahlman et al.

(10) Patent No.: US 6,868,279 B2
(45) Date of Patent: Mar. 15, 2005

(54) POWER CHARACTERISTIC OF A RADIO TRANSMITTER

(75) Inventors: Karl Gösta Sahlman, Älvsjö (SE); Hans Eriksson, Järfälla (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 248 days.

(21) Appl. No.: 10/169,141

(22) PCT Filed: Dec. 29, 2000

(86) PCT No.: PCT/SE00/02695

§ 371 (c)(1),
(2), (4) Date: Aug. 19, 2002

(87) PCT Pub. No.: WO01/50632

PCT Pub. Date: Jul. 12, 2001

(65) Prior Publication Data

US 2003/0040290 A1 Feb. 27, 2003

(30) Foreign Application Priority Data

Dec. 30, 1999 (SE) .............................................. 9904860

(51) Int. Cl.[7] ................................................ H04B 7/00
(52) U.S. Cl. ................... 455/522; 455/127.1; 455/115.1
(58) Field of Search ......................... 455/522, 91, 517, 455/127.1, 115.1, 69, 126; 341/144, 166, 120, 155; 370/317, 318

(56) References Cited

U.S. PATENT DOCUMENTS

| 5,809,017 A | * | 9/1998 | Smith et al. ................. 370/318 |
| 5,940,382 A | | 8/1999 | Haim |
| 6,169,886 B1 | * | 1/2001 | Black et al. ............... 455/127.2 |
| 6,380,875 B2 | * | 4/2002 | Honkanen et al. ........... 341/144 |
| 6,792,282 B1 | * | 9/2004 | Domino et al. .............. 455/522 |
| 6,795,712 B1 | * | 9/2004 | Vakilian et al. ............. 455/522 |
| 6,801,784 B1 | * | 10/2004 | Rozenblit et al. ........... 455/522 |

FOREIGN PATENT DOCUMENTS

| EP | 0535669 A1 | 4/1993 |
| EP | 0568516 A2 | 11/1993 |
| EP | 0632584 A1 | 1/1995 |
| WO | 9723062 A1 | 6/1997 |

* cited by examiner

Primary Examiner—Sonny Trinh
(74) Attorney, Agent, or Firm—Nixon & Vanderhye, P.C.

(57) ABSTRACT

The present invention relates to radio transmission of bursts in for example a TDMA cellular radio system. The burst starts with a ramping up period, ends with a corresponding ramping down ramping down period and with the pay-load information therebetween. The ramp form is created in a ramp generator (13) which gives a multiplication value to multiply the digital information to be transmitted in multipliers (15, 16). The multiplied values are converted into analogue form and amplified before being transferred to the antenna (21). Output power and temperature of the transmitting equipment are measured (22, 23) and used to update the output power levels during the next burst.

26 Claims, 5 Drawing Sheets

8-PSK symbol Mapping.

Examples of the output from the Data to Symbol Mapper

Pulse forming filter Response for the vector $I_0$

POWER CHARACTERISTIC OF A RADIO TRANSMITTER

This application is the US national phase of international application PCT/SE00/02695 filed 30 Dec. 1999, which designated the US.

TECHNICAL FIELD OF THE INVENTION

The present invention relates to the radio transmitter field and particularly to the characteristic of the output power when sending messages in the form of bursts.

DESCRIPTION OF RELATED ART

In modern wireless systems like digital cellular telephone systems some form of control of the output power have to be utilised. Especially in TDMA-systems where the channels are allocated to the users in the form of time slots with messages transmitted as bursts with short duration, it is not just the general power level which has to be controlled, but also the power in the start and stop phases. Uncontrolled power during these phases may create switching transients which results in spectrum spreading. This spreading could influence on other frequencies and cause interference. Thus, there is also a special need for control of the ramping up and down of the power in each burst.

The digital information is conventionally transferred into a vector model with in phase components I and quadrature components Q. These components control the modulation of the information on to the radio frequency carrier. The modulation could be of phase, frequency or amplitude type or a combination of them. During the actual sending of a burst the radio signal has an analogue character and the power level is chosen in relation to the particular environment like topography, distance to the receiver, other users of the system etc.

The key to accuracy in a power control solution is the accuracy in the power measuring device and the dynamic range of the power amplifiers used. A typical example of a power control system of prior art is outlined in FIG. 1. According to this drawing an input signal In is supplied to a variable gain amplifier, VGA, and then amplified in the main amplifier, PA. A sample of the output signal, Out, is provided by a coupler, Co, connected to a power measuring device, PMD. The measured value is compared to a set point value supplied by a reference value source, RVS, in an operational amplifier, OA. The result of the comparison—an error signal—is input to the VGA in a feedback loop for controlling the output power. By adjusting the reference value it is also possible to control the power along a preferred up and down sloped curvature at the beginning and end of a burst. This type of power regulation is widely used in TDMA-systems like the GSM having constant envelope power due to solely phase modulation, e.g. GMSK-modulation. An example of a solution in this area is shown in the U.S. Pat. No. 4,956,837.

The prior art solution requires typically in GSM an output power adjustment range of 30 dB. The ETSI standard specifies another 30 dB for the ramping up/down. To this one must add noise margin and device spread resulting in a total demand of 70–75 dB dynamic range for the output control. The wide dynamic requires high performance components like cascaded chains of gain controlling devices and logarithmic detector circuits with sufficient linear, response. Still there is a risk of introducing noise in the system. Another problem factor which the prior art solutions is the temperature drift of the amplifying components.

The patent publication EP 720 287 copes with the dynamic problems of the prior art. The solution is to adjust, not the preferred set point reference value, but the measured power output, whenever a change in the output is desired. For the adjustment a digitally controlled attenuator is used. However, variable gain amplifiers are used and the noise problem is not avoided.

The above mentioned prior art is not suitable for applications with linear modulation techniques like QPSK, 8-PSK, QAM etc, which also contain amplitude variations. In these cases there is a need for opening the feedback loop between the ramping up and down periods. Otherwise the power regulation will cancel out the amplitude variations and thus destroy the message sent.

Another patent publication, EP 535 669, handles the problem encountered with analogue loops and amplitude modulated signals. For correct power control behaviour the control loop needs to be closed after the start ramp and then reconnected again at the beginning of the end ramp. In between the control is kept in a sample and hold mode during the message transmission time. However, the switching in and out of the control will introduce transients in the output power disturbing other users of the system.

SUMMARY OF THE INVENTION

The object of the present invention is to provide a solution to the problem of generating a signal based on information in a burst form and make the signal suitable for transmission over the air interface at an appropriate power level.

Another object of the invention is to measure the output power level at certain instants of the burst and use this measurement to adjust the power level in the next burst.

A further object is to monitor the temperature of the transmitter power amplifier and adjust the output accordingly during next burst.

The solution is based on digital adaptation control and no analogue closed loop is utilised. The desired power level characteristic during a whole burst including the start and stop phases is delivered by a ramp generator and this function is combined with the information signal while still in its digital format. The result of the combination is converted to analogue form and further modified to make the signal suitable for transmitting purposes.

Because there is no need for closed loop control, there is neither any need for high performance variable gain amplifiers with wide range analogue control. The problem of noise introduction by this type of amplifiers is thus eliminated. Power measurements and control will be reduced to smaller range intervals and temperature drift of amplifiers will be taken into account.

The proposed power regulation system is furthermore independent of the modulation type used.

A method of creating an output power characteristic of a transmitted radio signal in the form of a burst according to the present invention is defined as it appears from the appended claim 1.

A transmitter system for transmitting radio signals in the form of bursts is defined as it appears from the appended claim 11.

A digital control circuit for supervising the method or system is defined as it appears from the appended claim 20.

DESCRIPTION OF PREFERRED EMBODIMENTS

Figure 1:
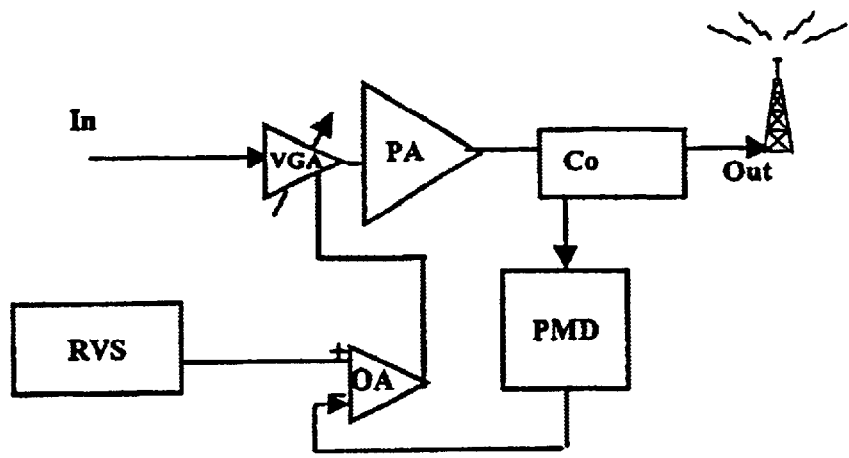
FIG. 1 shows a power control solution according to prior art.
Figure 2:
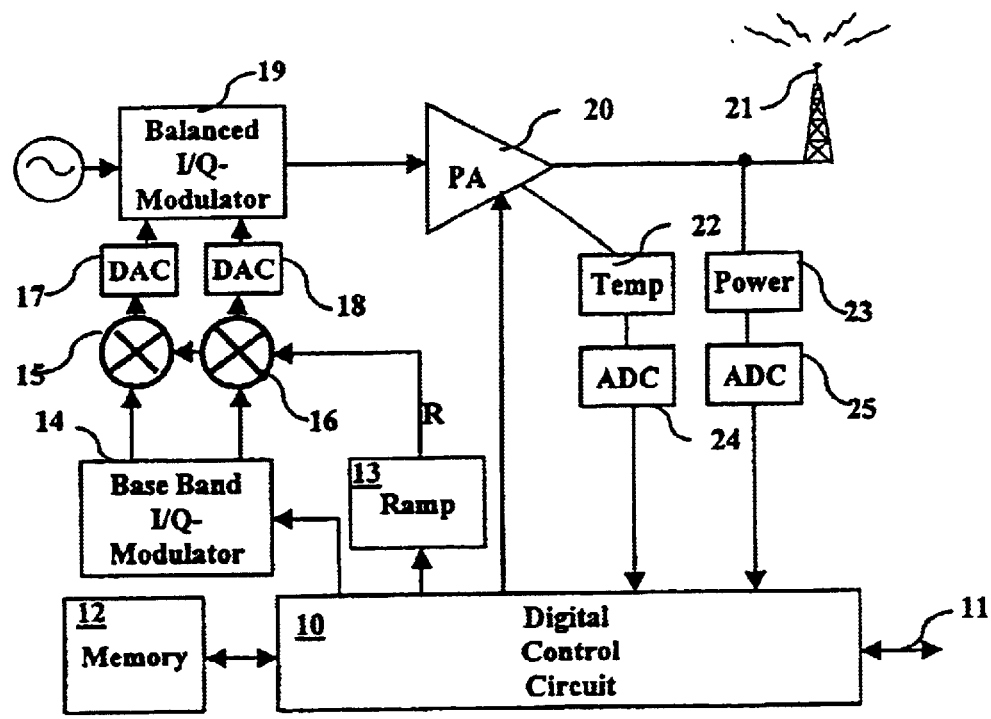
FIG. 2 outlines the general principles of the invention.

Referring to FIG. 2 a schematic drawing of a system for transmitting a radio message, according to the invention, is shown. The system comprises a digital control circuit, DCC, 10, connected to system interface 11 which delivers the transmitting information. The DCC includes a memory 12 for storing data related to the transmission, like carrier frequency, power level, burst form functions and temperature of the transmitter amplifiers. The DCC controls a ramp forming generator 13 and an I- and Q-base-band digital modulator 14, including a data to symbol mapper. In a combining device illustrated as multipliers 15, 16 the I/Q values are combined with the ramp function R generated by the generator 13. The combined signals are converted into analogue form in digital to analogue converters DAC, 17, 18. The DAC drives the input of an analogue balanced modulator 19. The modulated signal is amplified in a power amplifier 20 before being brought to the antenna 21.

The system in FIG. 2 also includes power and temperature measuring devices 22, 23. The power and temperature values are converted to digital form in the ADC-devices 24 and 25 before being transferred to the DCC, 10 and stored in the memory 12.

Figure 3:
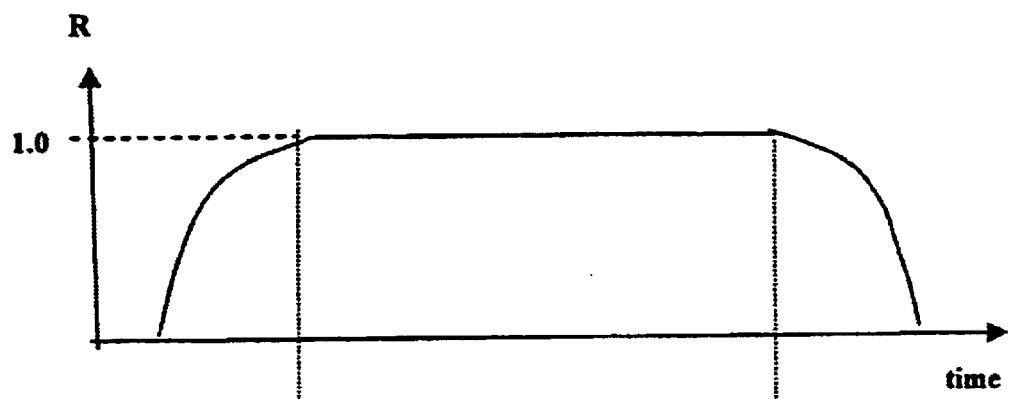
FIG. 3 shows the ramp function.

FIG. 3 illustrates the ramp function R created by the ramp generator 13 in FIG. 2.

Figure 4:
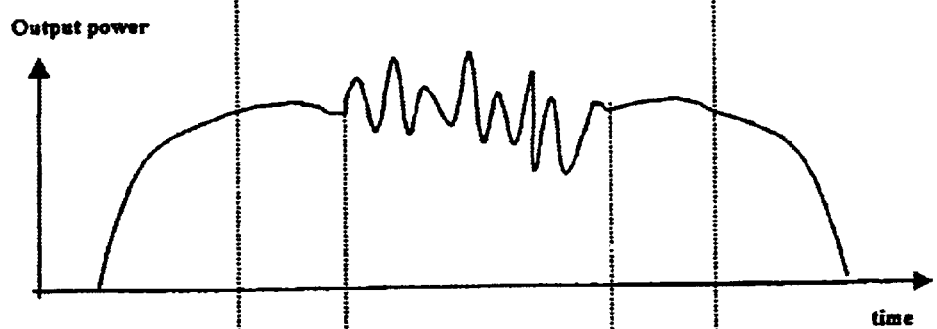
FIG. 4 the output power of a burst.

FIG. 4 indicates how the magnitude of the output power level is altered due to the multiplication with the ramp function. The resultant variation corresponds to the ramp function during ramping up and down periods in particular when the amplitude variations of the I/Q vectors are low. However, certain amplitude variation, causing a ripple in the output power during the ramping periods, may be present. Between these periods the rampfunction is substantially constant and amplitude variations in the burst are unaffected.

Figure 5:
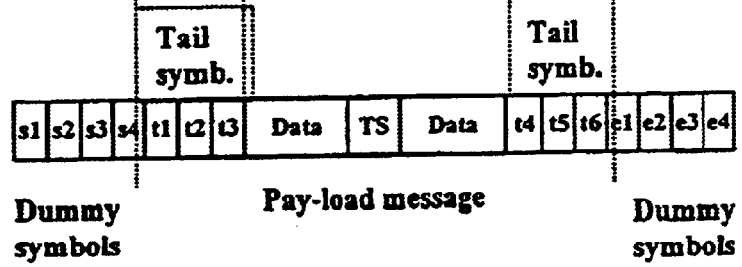
FIG. 5 represents the symbols of a time slot.
Figure 6:
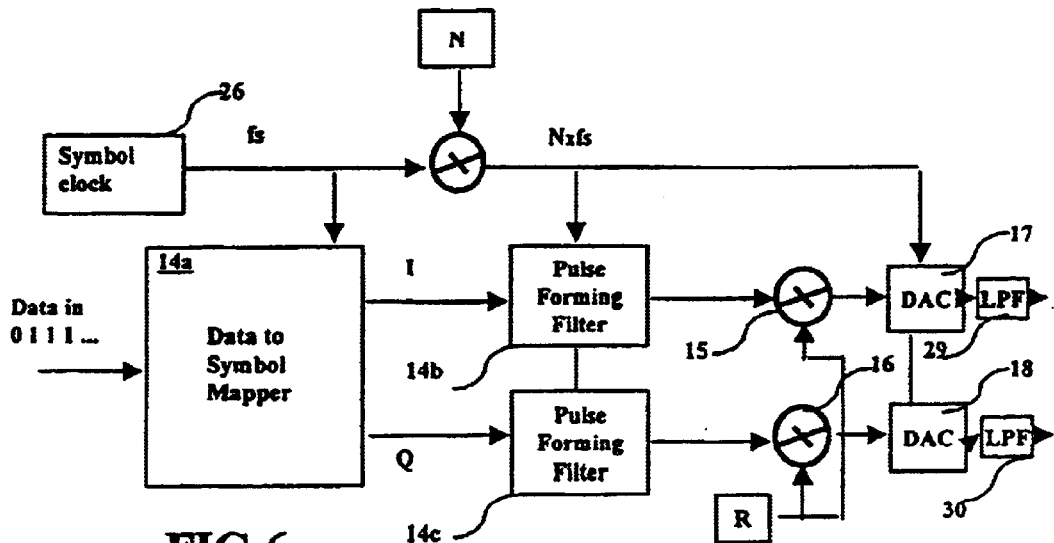
FIGS. 6–9 shows how the I/Q symbols are created.
Figure 7:
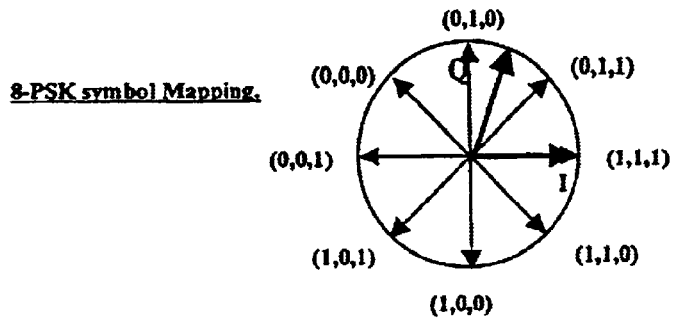

In FIG. 5 the symbol contents of a time slot of information in a TDMA-system is shown. The slot starts and ends with dummy symbols s1–s4 and e1–e4 respectively. These symbols are chosen to give known power output, preferably with a minimum amplitude variation, when converted into a radio signal. The actual pay-load message including a training sequence TS is surrounded by tail symbols t1–t3, t4–t6. The tail symbols are specified, e.g. according to the ⅜ PI 8-PSK modulation scheme, to get an output power level in the particular part of the transmitted burst, which is predictable by the system.

A more specified illustration of the forming of the I/Q-values with filtering and the multiplication is represented in FIGS. 6–9. Digital data bits are transferred to the data to symbol mapper 14a. In this mapper the bits are grouped together, for example three bits per group. This creates eight different groups (from 000 to 111) which groups or symbols can be plotted in a phase diagram, FIG. 7, and the I and Q values are represented by the I and Q coordinates in the diagram. A symbol clock 26 governs the symbol rate, fs, which according to the example is one third of the bit rate.

Figure 8:
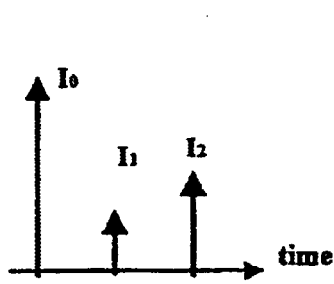
Figure 9:
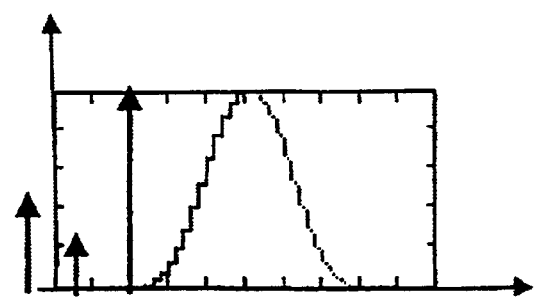

Examples of I impulse values are shown in FIG. 8. The impulses are broadened out in pulse forming filters 14a and 14b. The filter is digital with an oversampling frequency of N times the symbol rate fs. An example of the impulse response is illustrated in FIG. 9 and the envelope of the response is shown. Still in its digital form the filtered signals are multiplied by the rampfunction R in the multipliers 15, 16 before being brought into analogue form by the DACs 17, 18 and low pass filtered in LPFs 29, 30.

Figure 10:
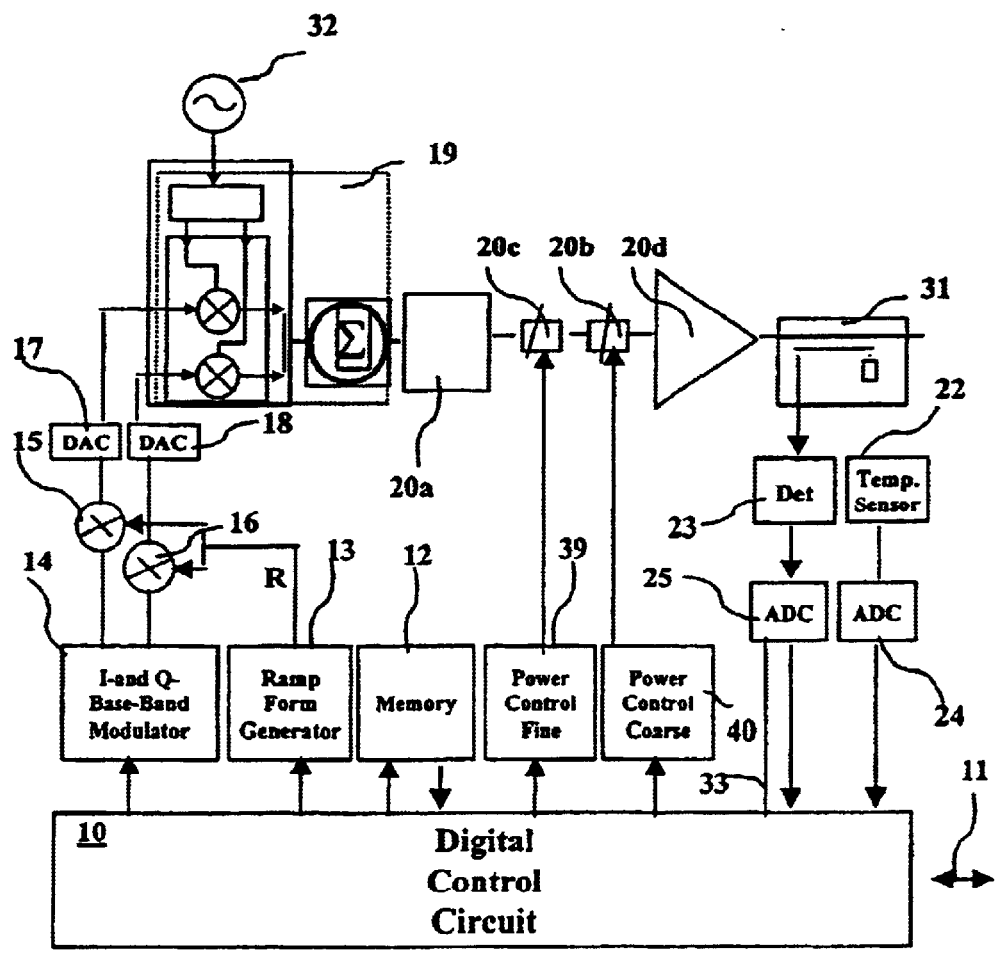
FIG. 10 is a more detailed description and FIG. 11 shows some alternative embodiments.

A more detailed explanation of the system in FIG. 2 is now presented with reference also to FIG. 10. The power amplification stage 20 in FIG. 2 is divided into a gain stage 20a (which may include further up-conversion to a final carrier frequency) and two digitally controlled step attenuators, one coarse 20b and one fine 20c, together with the main power amplifier 20d. A coupler 31 provides a sample of the output power level for the power detector 23. The DCC 10 receives over the system interface 11 information about the next burst to be transmitted. The information contains the data message to be transmitted, the frequency and a desired power level for the transmission. The DCC looks in its memory 12 for data to program a local oscillator 32 belonging to the balanced modulator 18. The DCC has gained knowledge about the temperature of the transmitter by reading the output from the ADC 24 connected to the temperature sensor 22. This sensor preferably measures the temperature in the main power amplifier 20d, in which component most of the heat is produced. The temperature information is used to improve the accuracy of the power measuring device by looking for calibration values for that device stored in the look up table in the memory of the DCC.

The DCC has also collected a value of the actual power level delivered in a previous burst. The collected value represents the power level during sending of the known tail symbols t1–t3 or t4–t6, see FIG. 3. The selection of the time period during which the particular power level value is collected is indicated by arrow 33 in FIG. 10. By comparison with the desired value calculated on the basis of the known tail bits, a correction for the output during the next burst can be estimated. The correction value is used to update a table in the memory 12. This power regulation system ensures that correct power levels are transmitted.

The coarse desired power level value is used to set the coarse step attenuator 20b and the correction for temperature and actual power level is used to set the fine attenuator 20c. The set information is of a digital nature created by the DCC and delivered to the input controls of the step attenuators via power control interfaces 39 and 40.

The DCC controls the base band modulator 14 which converts the incoming data message into suitable I- and Q-vectors, depending of the modulation type used. The DCC also reads from its memory a ramp form function which is delivered to the ramp generator 13. The ramp form may be dependant of the transmitting frequency and the power level and is not necessarily the same in the beginning and the end of a burst.

Figure 11:
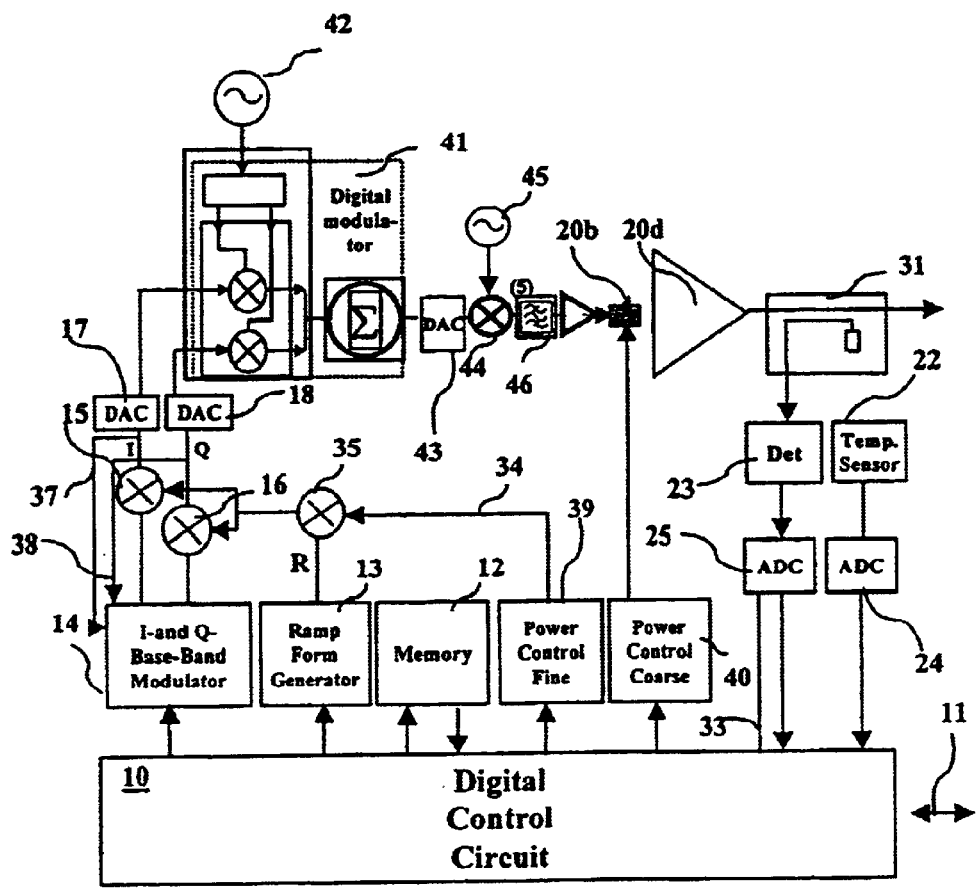

Some alternative solutions to those described in FIG. 10 are shown in FIG. 11. These alternatives should be regarded as single embodiments or used in combination, although presented in a single figure.

Instead of adjusting the fine step attenuator the power correction value adjusts the rampfunction as shown in FIG. 11 by the connection 34 between the power control fine interface 39 and a multiplicator 35. In this case the fine step attenuator could be omitted.

As an alternative to power measurements during sending of known tail bits, the power is measured during an arbitrarily chosen time period. The predicted comparison value during this period is calculated by referring back the I/Q-values occurring during this period, see the arrows 37 and 38, and the DCC opens the ADC 25 at the same time period, arrow 33.

A third alternative is an embodiment where the first intermediate carrier modulation is performed in the digital domain. This feature is realised in FIG. 11 by replacing the former modulator with a digital balanced modulator 41, which works together with a numerically controlled oscillator 42. This modulated information signal is converted into analogue form in DAC 43 and further upconverted in a block containing an RF-mixer 44 a programmable RF-oscillator and an image rejecting bandpass filter 46. An advantage with direct digital synthesis of the intermediate modulation is that carrier leakage from the local oscillator is avoided due to better precision in the digital domain.

A digital adaptive control with no closed analogue loops makes a significant improvement in performance. No switching transients will be present due to change in analogue loop bandwidth control. As no voltage or current controlled variable gain amplifiers are used, noise and accuracy problems are reduced. Using digitally controlled step attenuators improves accuracy and reduces ageing because control components containing fixed resistive attenuators are used instead of analogue control means.

What is claimed is:

1. A method of creating an output power level characteristic of a radio information signal transmitted under supervision of a digital control circuit, DCC (10), in the form of a burst (s1–e4) beginning with a ramping up period (s1–s4), ending with a corresponding ramping down period (e1–e4) and with the actual pay-load message (t1–t6) signal therebetween and wherein the information signal originates from a digital signal which is converted into an analogue form and amplified for transmitting purposes, characterised in the following steps, generating a digital ramp function (R) based on the desired slope of said ramping up and down periods and with a substantially flat portion in between, combining the ramp function (R) and the information signal (s1–e4) while still in their digital form.

2. A method according to claim 1 in which parts of the message signal appearing at a certain time instant are identified by the system and used to predict the output power level during the time interval in which these parts are sent, characterised in that the actual output power level is measured during this time instant.

3. A method according to claim 1 wherein the temperature of the transmitting equipment is measured.

4. A method according to claim 1 wherein the measured power level and/or temperature value are used to adjust the amplification for the next burst.

5. A method according to claim 1 wherein the digital information signal is transformed from bits into symbols represented by I-, in phase, and Q-, quadrature, vectors, which digital vectors are combined with the ramp function by multiplication.

6. A method according to claim 5 wherein the multiplied signals are converted to analogue form in digital to analogue converters (17, 18) and then modulated in a balanced modulator (19) controlled by a local oscillator (32).

7. A method according to claim 5 wherein the multiplied signals are digitally modulated in a balanced modulator (41) controlled by a numerical oscillator (42) and then converted into analogue form in a digital to analogue converter (43).

8. A method according to claim 2 in which the signal parts after transformation appear as tail symbols, known in advance, in the beginning and/or end of the message signal.

9. A method according to claim 2 in which the signal parts, transformed into I- or Q-symbols, are referred back to the digital control circuit for estimating the output power resulting from these symbols.

10. A method according to claim 2 wherein the measured power level and/or temperature value are combined with a new ramp function for the next burst in a multiplier.

11. A transmitter system for transmitting radio signals in the form of bursts under the supervision of a digital control circuit DCC (10) wherein each burst (s1–c4) starts with a ramping up period and ends with a corresponding ramping down period with the actual payload message signal in between, including a source (14) for digital information to be sent, a digital to analogue converter (17, 18; 43), a modulator (19; 41), an amplification stage (20) and an antenna (21) characterised in that the transmitter system further includes a ramp generator (13) which generates a ramp function based on the desired ramping up and down slopes and with a substantially flat portion in between and a combining device (15, 16) connected to the information source (14) and the output of the ramp generator (13) which combines the digital information with the ramp-function (R).

12. A transmitter system as in claim 11 including an output power measuring device (23) connected to an analogue to digital converter (25) and whose resulting digital output power value is transferred to the DCC during certain time intervals (16).

13. A transmitter system as in claim 11 including a temperature sensor for measuring the temperature in the amplification stage and connected to a digital to analogue converter and whose resulting digital value is transferred to the DCC.

14. A transmitter system as in claim 11 wherein the amplification stage includes a step attenuator with its control input connected to the DCC via a power control interface.

15. A transmitter system as in claim 14 wherein the step attenuator (20c) is controlled in fine steps and wherein the amplification stage (20) is further divided in a gain stage (20a), a main power amplifier (20d) and a second step attenuator (20b)controlled in coarse steps with its control input connected to the DCC via a second control interface (40).

16. A transmitter system as in claim 11 wherein the information source is a base band modulator with a signal data to symbol mapper and with filters which converts bit data into symbols represented by I-, in phase, and Q-, quadrature, vectors which vectors are digitally combined with the ramp function in multiplicators.

17. A transmitter system as in claim 16 wherein it further includes digital to analogue converters (17, 18) followed by a balanced modulator (19) in the analogue domain.

18. A transmitter system as in claim 16 wherein it further includes a modulator (41) in the digital domain followed by a digital to analogue converter (43).

19. A transmitter system as in claim 12 which includes a further combining device (35) which combines power correction values with the new ramp function (R) for the next burst.

20. A digital control circuit, DCC, for supervising the method in claim 1 or the system in claim 11 comprising means for performing control over the radio transmission and an interface (11) through which the transmission information is received characterised in that it includes a memory for the parameters of the ramp function (R), control means (39, 40) for adjusting the output power level.

21. Control circuit according to claim 20 in which the memory comprises a table with stored data corresponding to transmitting frequency, temperature of the transmitting circuitry, desired output power level, detected output power level and calibration values for the power measuring devices versus temperature.

22. Control circuit according to claim 20 in which the memory is updated after each burst.

23. Control circuit according to claim 20 wherein output power levels are collected from the transmitter output via a detector and an analogue to digital converter, which converter output is time controlled and only opens when the output power level is predictable due to prior knowledge of the information sent during certain time controlled instants.

24. Control circuit according to claim 23 wherein the time controlled power values are compared to the predicted desired power values for calculating new power values for the next burst.

25. Control circuit according to claim 20 wherein a temperature value is collected from the amplification stage of the transmitter, which temperature value is used to adjust the output power level in the next burst.

26. Control circuit according to claim 20 wherein certain information, converted into I/Q symbols, are collected during certain instants for prediction of the output power level and that the time controlled converter is open at substantially the same time.

* * * * *